(12) United States Patent  (10) Patent No.: US 7,091,079 B2
Chen et al.  (45) Date of Patent: Aug. 15, 2006

(54) METHOD OF FORMING DEVICES HAVING THREE DIFFERENT OPERATION VOLTAGES

(75) Inventors: Jung-Ching Chen, Tai-Chung Hsien (TW); Jy-Hwang Lin, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 86 days.

(21) Appl. No.: 10/904,455

(22) Filed: Nov. 11, 2004

(65) Prior Publication Data

US 2006/0099753 A1  May 11, 2006

(51) Int. Cl.
*H01L 21/8238* (2006.01)

(52) U.S. Cl. .............. 438/199; 438/218; 438/223; 438/275

(58) Field of Classification Search .............. 438/197, 438/199, 218–219, 223–224, 233, 275–276, 438/279, 283

See application file for complete search history.

(56) References Cited

U.S. PATENT DOCUMENTS

| 6,133,164 | A  | * | 10/2000 | Kim ........................... 438/275 |
| 6,551,884 | B1 | * | 4/2003 | Masuoka .................... 438/275 |
| 6,602,751 | B1 | * | 8/2003 | Oohashi ..................... 438/275 |
| 6,890,822 | B1 | * | 5/2005 | Kim et al. .................. 438/275 |
| 6,897,104 | B1 | * | 5/2005 | Tsujikawa et al. .......... 438/216 |

* cited by examiner

*Primary Examiner*—Thanhha Pham
(74) *Attorney, Agent, or Firm*—Winston Hsu (57) ABSTRACT

The present invention provides a method of forming devices having different operation voltages. First, a substrate having an HV region, an MV region, and an LV region is provided. Then, at least a deep well encompassing the LV region and the MV region is formed in the substrate. Afterward, a plurality of n-wells and a plurality of p-wells are in the HV region, the MV region, and the LV region. Following that, a plurality of HV devices are formed in the HV region, a plurality of MV devices are formed in the MV region, and a plurality of LV devices are formed in the LV region.

29 Claims, 10 Drawing Sheets

METHOD OF FORMING DEVICES HAVING THREE DIFFERENT OPERATION VOLTAGES

BACKGROUND OF THE INVENTION

1. Field of the Invention

The present invention relates to a method of forming devices having three different operation voltages, and more particularly, to a method of forming HV devices, MV devices, and LV devices where the MV devices and the LV devices are able to be unaffected under operations of the HV devices.

2. Description of the Prior Art

Figure 1:
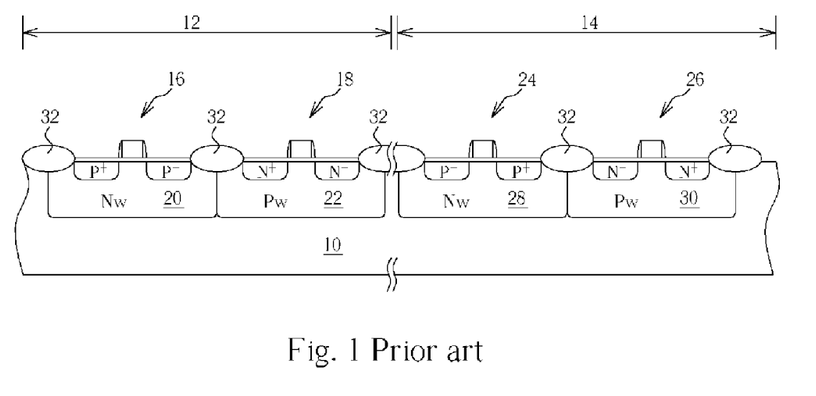
FIG. 1 is a schematic diagram illustrating LV devices and HV devices integrated in a substrate.

Due to the advantages of low cost and tiny size, the concept of system on chip (SOC) has been progressively developed. Although integration of different devices, such as HV devices, LV devices, and memory devices, is beneficial in many aspects, there still exists difficulties in integrating different devices. Currently, HV devices and LV devices (i.e. 18V/3.3V) or MV devices and LV devices (i.e. 5V/3.3V) have been integrated. Please refer to FIG. 1. FIG. 1 is a schematic diagram illustrating LV devices and HV devices integrated in a substrate. As shown in FIG. 1, the substrate 10 is classified into an LV region 12, and an HV region 14. The substrate includes an LVPMOS device 16 and an LVNMOS device 18 respectively positioned on an n well 20 and a p well 22 in the LV region 12, and an HVPMOS device 24 and an HVNMOS device 26 respectively positioned on an n well 28 and a p well 30 in the HV region 14. In addition, all MOS devices are isolated by field oxide layers 32.

The conventional integration of HVMOS and LVMOS, however, suffers the following issues. First, due to insufficient isolations, the LVMOS may be affected during operations of the HVMOS, particularly when the HVMOS operates in a high positive voltage and in a high negative voltage. In addition, since only HVMOS and LVMOS (or MVMOS) are integrated, the application is limited.

SUMMARY OF THE INVENTION

It is therefore a primary objective of the present invention to provide a method of forming transistors having three different operation voltages, comprising the following steps:

providing a substrate, the substrate being a first conductive type well, and comprising a high voltage (HV) region, a medium voltage (MV) region, and a low voltage (LV) region;

forming at least a deep well with a second conductive type encompassing the LV region and the MV region in the substrate;

forming a plurality of first conductive type wells and second conductive type wells in the HV region, the MV region, and the LV region;

forming a gate oxide layer with a first thickness on the substrate, and covering the HV region, the MV region, and the LV region;

performing a first implantation process upon the MV region and the LV region, and partially removing the gate oxide layer in the MV region and the LV region so that the gate oxide layer has a second thickness in the MV region and the LV region;

performing a second implantation process upon the LV region, and partially removing the gate oxide layer in the LV region so that the gate oxide layer has a third thickness in the LV region;

forming a gate over each first conductive type well and each second conductive type well; and forming a source and a drain in each first conductive type well and each second conductive type well to respectively form a plurality of HV transistors in the HV region, a plurality of MV transistors in the MV region, and a plurality of LV transistors in the LV region.

These and other objectives of the present invention will no doubt become obvious to those of ordinary skill in the art after reading the following detailed description of the preferred embodiment that is illustrated in the various figures and drawings.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 2:
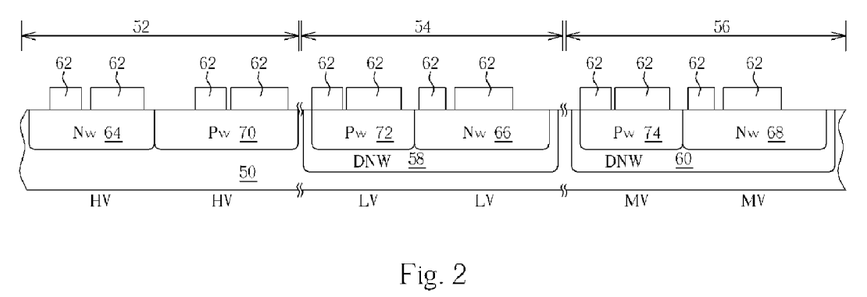
FIG. 2 to FIG. 10 are schematic diagram illustrating the steps of forming devices having different operation voltages according to a preferred embodiment of the present invention.

Please refer to FIG. 2 to FIG. 10. FIG. 2 to FIG. 10 are cross-sectional schematic diagram illustrating the steps of forming devices having different operation voltages according to a preferred embodiment of the present invention. As shown in FIG. 2, a substrate 50 having at least an HV region 52, at least an LV region 54, and at least an MV region 56 is provided. In the HV region 52, a plurality of HVMOS devices (18V or −9V to +9V) including HVNMOS device and HVPMOS device are to be formed. In the LV region 54, a plurality of LVMOS devices (3.3V) including LVNMOS device and LVPMOS device are to be formed. In the MV region 56, a plurality of MVMOS devices (5V) including MVNMOS device and MVPMOS device are to be formed.

Then, an n type implantation process is performed to form two deep n wells (DNW) 58 and 60 respectively in the LV region 54 and in the MV region 56 of the substrate 50. Subsequently, a thermal drive-in process is carried out to activate the deep n wells 58 and 60. Following that, a pad oxide layer (not shown) and a silicon nitride pattern 62, which are used to define positions of isolation structures to be formed (i.e. field oxide layers or shallow trench insulators) are consecutively formed on the substrate 50. Afterward, an n type implantation process and a p type implantation process are consecutively performed to respectively form n wells 64, 66, and 68 in the HV region 52, the LV region 54, and the MV region 56, and p wells 70, 72, and 74 in the HV region 52, the LV region 54, and the MV region 56. It is appreciated that the deep n wells 58 and 60 encompass the LV region 54 and the MV region 56 so that MOS devices to be formed in the LV region 54 and the MV region 56 are unaffected by operations of MOS devices to be formed in the HV region 52.

Figure 3:
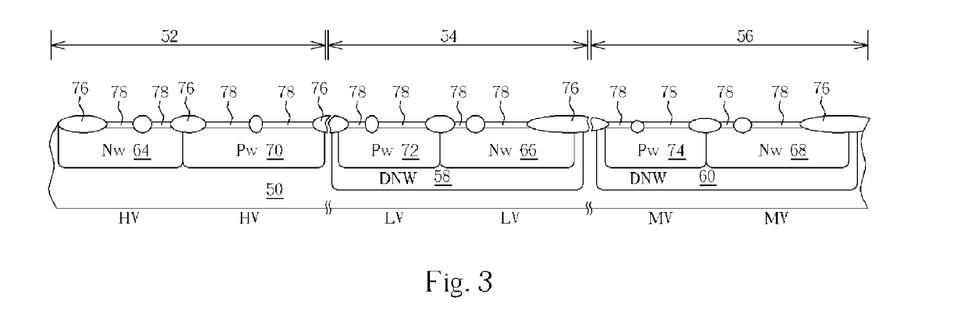

As shown in FIG. 3, a plurality of field oxide layers 76 are formed on the substrate 50 by performing an oxidization process, and the silicon nitride pattern (not shown) is then removed. A sacrificial silicon oxide layer (not shown) can be selectively formed on the substrate 50, and then removed to repair the surface of the substrate 50. Thereafter, a silicon oxide layer 78 of 300–500 angstroms is formed on the surface of the substrate 50 in the HV region 52, the LV region 54, and the MV region 56.

Figure 4:
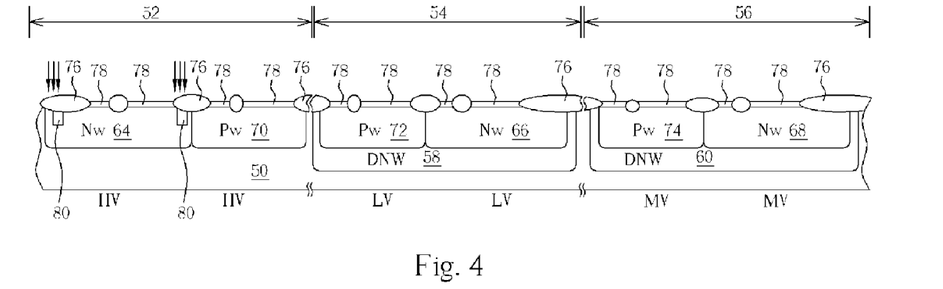

As shown in FIG. 4, an n type implantation process is performed to form channel stop layers 80 (or guard rings) under the field oxide layers 76 of the n well 64. Following that, two implantation processes are consecutively performed to adjust threshold voltages of the HVNMOS device and the HVPMOS device to be respectively formed in the p well 70 and the n well 64 of the HV region 52.

Figure 5:
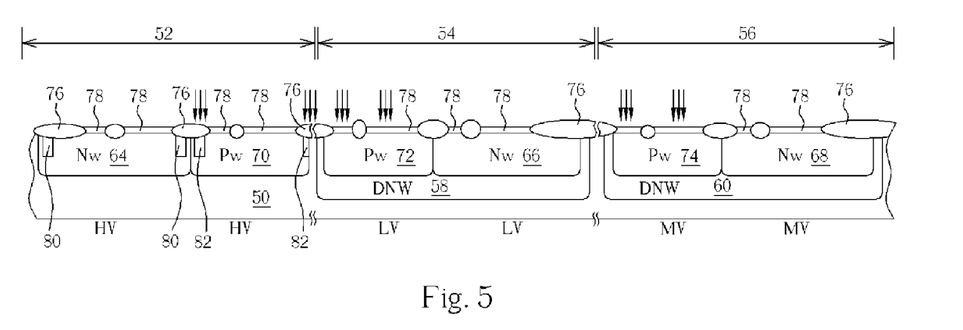

As shown in FIG. 5, a p type implantation process is performed to form channel stop layers 82 under the field oxide layers 76 of the p well 70. In the p type implantation process, the p wells 72 and 74 are also re-implanted to adjust dopant concentrations of the p wells 72 and 74.

Figure 6:
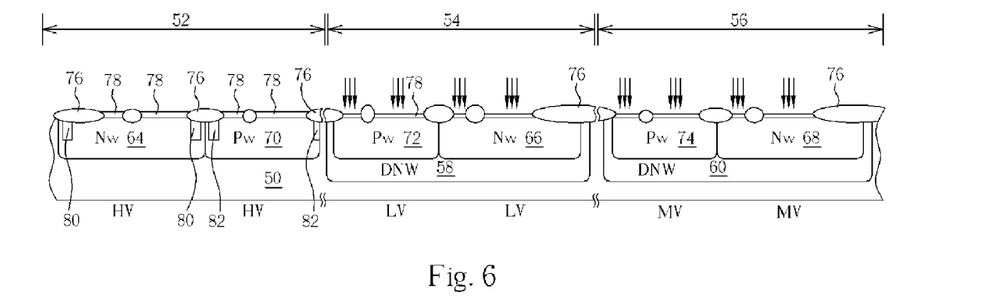

As shown in FIG. 6, an implantation process is performed with a mask pattern (not shown), exposing the LV region 54 and the MV region 56, to adjust the threshold voltages of MOS devices to be formed in the LV region 54 and the MV region 56. Subsequently, an etching process is performed with the same mask pattern (not shown) to thin the silicon oxide layer 78 in the LV region 54 and in the MV region 56 to a thickness, preferably to a thickness of 100–120 A.

Figure 7:
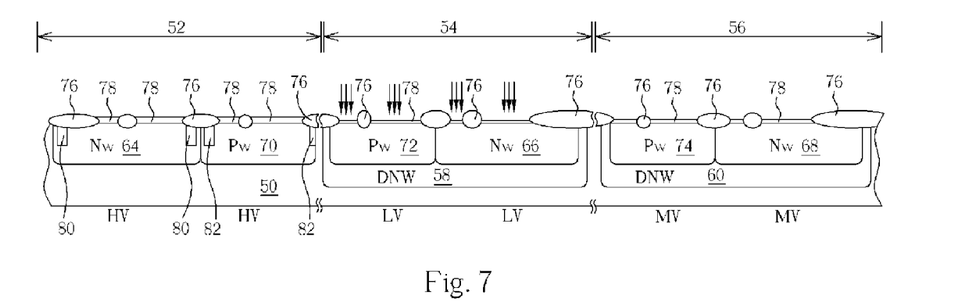

As shown in FIG. 7, another implantation process is performed with another mask pattern (not shown), exposing the LV region 54, to adjust the threshold voltages of MOS devices to be formed in the LV region 54. Subsequently, another etching process is performed with the same mask pattern (not shown) to thin the silicon oxide layer 78 in the LV region 54 to a thickness, preferably to a thickness of 50–80 A. It is noteworthy that the silicon oxide layer 78 are consecutively thinned along with the steps of adjusting the threshold voltages for respectively forming gate insulating layers having different thickness in accordance with HVMOS devices to be formed in the HV region 52, LVMOS devices to be formed in the LV region 54, and MVMOS devices to be formed in the MV region 56.

Figure 8:
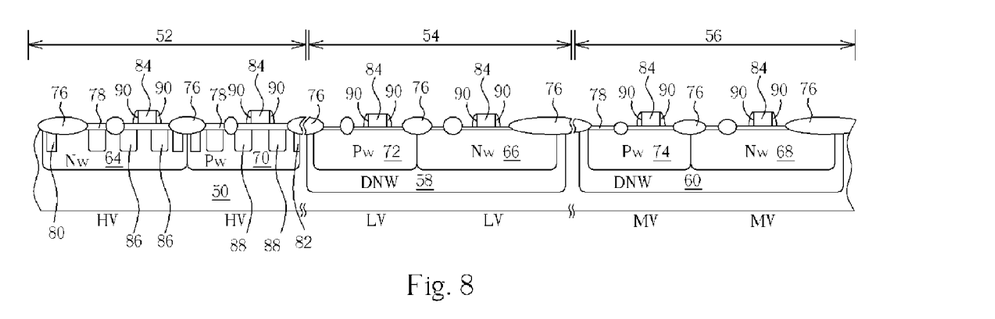

As shown in FIG. 8, a polysilicon layer (not shown) and a polycide layer, e.g. tungsten silicide, (not shown) are deposited on the substrate 50, and a photo-etching process is then performed to forming a plurality of gates 84 on the silicon oxide layer 78 over the n wells 64, 66, 68, and the p wells 70, 72, 74. Afterward, a p type implantation process is performed to form p type doped regions 86 in the n well 64 of the HV region 52, and an n type implantation process is performed to form n type doped regions 88 in the p well 70 of the HV region 52. Subsequently, a spacer structure 90 is formed alongside each gate 84.

Figure 9:
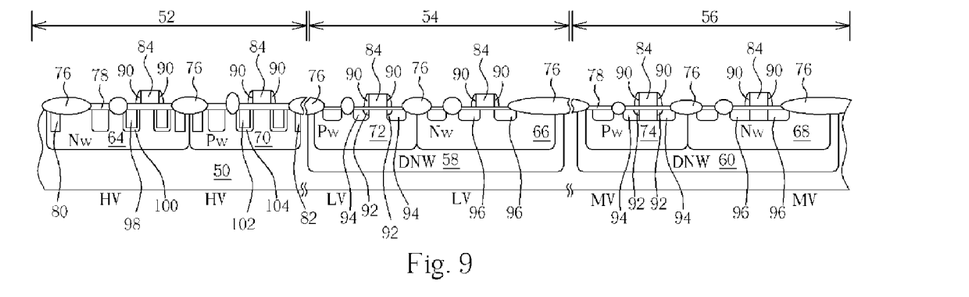

As shown in FIG. 9, a light implantation process is performed to form lightly doped drains (LDD) 92 in the p well 72 of the LV region 54 and in the p well 74 of the MV region 56. Then, n type heavily doped regions (source/drain) 94 are formed in the p wells 72 and 74, and p type heavily doped regions (source/drain) 96 are formed in the n wells 66 and 68 consecutively. Subsequently, a p type implantation process is performed to form two p type heavily doped regions 98, which respectively serve as source/drain, and two double diffused drains (DDD) 100 respectively around each p type heavily doped region 98 in the n well 64. Following that, an n type implantation process is performed to form two n type heavily doped regions 102, which respectively serve as source/drain, and two double diffused drains 104 respectively around each n type heavily doped region 102 in the p well 70. Thereafter, the substrate 50 is annealed to drive in the doped regions.

Figure 10:
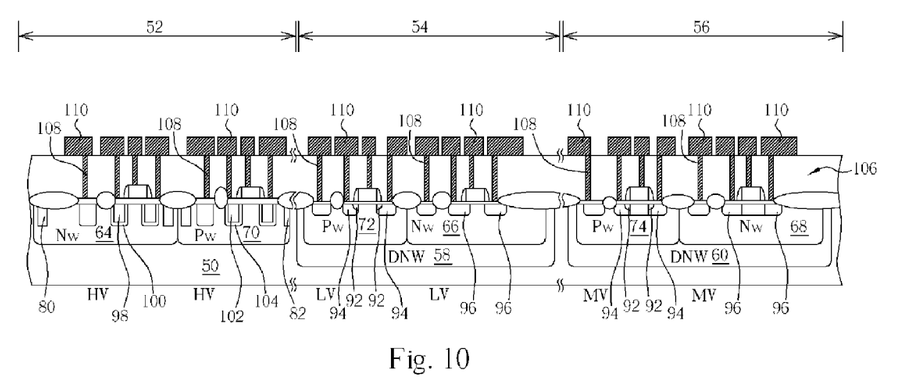

As shown in FIG. 10, an interconnect formation process including depositing an interdielectric layer (IDL) 106, forming a plurality of contact plugs 108 corresponding to terminals of each MOS device, such as gate, doped regions, n well, or p well, and forming a plurality of metal conducting wires 110 electrically connected to the plugs, is performed.

It is advantageous to adopt the present invention because: (1) HVMOS devices, MVMOS devices, and LVMOS devices are integrated; (2) the LV region and the MV region are surrounded by deep n wells so that operations of HVMOS devices do not interfere with operations of LVMOS devices and MVMOS devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming transistors having three different operation voltages, comprising:

providing a substrate, the substrate being a first conductive type well and comprising a high voltage (HV) region, a medium voltage (MV) region, and a low voltage (LV) region;

forming at least a deep well with a second conductive type encompassing the LV region and the MV region in the substrate;

forming a plurality of first conductive type wells and second conductive type wells in the HV region, the MV region, and the LV region;

forming a gate oxide layer with a first thickness on the substrate, and covering the HV region, the MV region, and the LV region;

performing a first implantation process upon the MV region and the LV region, and partially removing the gate oxide layer in the MV region and the LV region so that the gate oxide layer has a second thickness in the MV region and the LV region;

performing a second implantation process upon the LV region, and partially removing the gate oxide layer in the LV region so that the gate oxide layer has a third thickness in the LV region;

forming a gate over each first conductive type well and each second conductive type well; and forming a source and a drain in each first conductive type well and each second conductive type well to respectively form a plurality of HV transistors in the HV region, a plurality of MV transistors in the MV region, and a plurality of LV transistors in the LV region.

2. The method of claim 1, wherein the step of forming the gate over each first conductive type well and each second conductive type well comprises:

depositing a polysilicon layer on the substrate;

depositing a polyside layer on the polysilicon layer; and performing a photo-etching process to form the gate over each first conductive type well and each second conductive type well.

3. The method of claim 1, wherein the step of forming the source and the drain in each first conductive type well and each second conductive type well further comprises forming lightly doped drains (LDD) in the MV region and in the LV region.

4. The method of claim 1, wherein the step of forming the source and the drain in each first conductive type well and each second conductive type well further comprises forming double diffuse drains (DDD) in the HV region.

5. The method of claim 1, further comprising a step of forming interconnects after the source and the drain in each first conductive type well and each second conductive type well are formed.

6. The method of claim 1, further comprising forming a silicon nitride pattern on the substrate after the deep well is formed.

7. The method of claim 6, further comprising forming a plurality of isolation structures on the substrate after the first conductive type wells and the second conductive type wells are formed.

8. The method of claim 7, wherein the isolation structures are field oxide layers.

9. The method of claim 7, wherein the isolation structures are shallow trench isolation structures.

10. The method of claim 7, further comprising removing the silicon nitride pattern after the isolation structures are formed.

11. The method of claim 7, further comprising forming a channel stop layer underneath the isolation structures in the HV region after the gate oxide layer is formed.

12. The method of claim 1, further comprising respectively forming the first conductive type wells and the second conductive type wells in the HV region after the gate oxide layer is formed.

13. The method of claim 1, wherein the first conductive type is P type, and the second conductive type is N type.

14. The method of claim 1, wherein the first thickness is ranging from 300 to 500 angstrom.

15. The method of claim 1, wherein the second thickness is ranging from 90 to 120 angstrom.

16. The method of claim 1, wherein the third thickness is ranging from 50 to 80 angstrom.

17. A method of forming devices having different operation voltages, comprising:
providing a substrate, the substrate comprising an HV region, an MV region, and an LV region;
forming at least a deep well encompassing the LV region and the MV region in the substrate;
forming a plurality of n-wells and a plurality of p-wells in the HV region, the MV region, and the LV region; and
forming a plurality of HV devices in the HV region, a plurality of MV devices in the MV region, and a plurality of LV devices in the LV region, the HV devices comprising HV NMOS devices and HV PMOS devices, the MV devices comprising MV NMOS devices and MV PMOS devices, and the LV devices comprising LV NMOS devices and LV PMOS devices.

18. The method of claim 17, further comprising forming interconnects after the HV devices, the MV devices, and the LV devices are formed.

19. The method of claim 17, wherein the step of forming the n-wells and the p-wells in the HV region, the MV region, and the LV region further comprises:
forming a silicon nitride pattern on the substrate;
forming the n-wells in the HV region, the MV region, and the LV region;
forming the p-wells in the HV region, the MV region, and the LV region;
forming a plurality of isolation structures on the substrate; and
removing the silicon nitride pattern.

20. The method of claim 19, wherein the isolation structures are field oxide layers.

21. The method of claim 19, wherein the isolation structures are shallow trench isolation structures.

22. The method of claim 19, wherein the step of forming the HV devices, the MV devices, and the LV devices further comprises:
forming a gate oxide layer on the substrate, the gate oxide layer having a first thickness and covering the HV region, the MV region, and the LV region;
performing a first implantation process upon the MV region and the LV region, and partially removing the gate oxide layer in the MV region and the LV region so that the gate oxide layer has a second thickness in the MV region and the LV region;
performing a second implantation process upon the LV region, and partially removing the gate oxide layer in the LV region so that the gate oxide layer has a third thickness in the LV region;
forming a gate over each n-well and each p-well; and
forming a source and a drain in each n-well and each p-well to respectively form the HV devices in the HV region, the MV devices in the MV region, and the LV devices in the LV region.

23. The method of claim 22, further comprising forming a channel stop layer underneath the isolation structures in the HV region after the gate oxide layer is formed.

24. The method of claim 22, wherein the step of forming the gate over each n-well and each p-well comprises:
depositing a polysilicon layer on the substrate;
depositing a polyside layer on the polysilicon layer; and
performing a photo-etching process to form the gate over each n-well and each p-well.

25. The method of claim 22, wherein the step of forming the source and the drain in each n-well and each p-well further comprises forming lightly doped drains (LDD) in the MV region and in the LV region.

26. The method of claim 22, wherein the step of forming the source and the drain in each n-well and each p-well further comprises forming double diffused drains (DDD) in the HV region.

27. The method of claim 22, wherein the first thickness is ranging from 300 to 500 angstrom.

28. The method of claim 22, wherein the second thickness is ranging from 90 to 120 angstrom.

29. The method of claim 22, wherein the third thickness is ranging from 50 to 80 angstrom.

* * * * *